United States Patent
Imade et al.

(10) Patent No.: US 6,768,201 B1
(45) Date of Patent: Jul. 27, 2004

(54) SEMICONDUCTOR DEVICE AND METHOD FOR FABRICATING THE SAME

(75) Inventors: Masahiro Imade, Osaka (JP); Hiroyuki Umimoto, Hyogo (JP); Satoe Miyata, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/618,730

(22) Filed: Jul. 15, 2003

(30) Foreign Application Priority Data

Feb. 17, 2003 (JP) ........................................ 2003-038113

(51) Int. Cl.⁷ .............................................. H01L 23/48
(52) U.S. Cl. ........................ 257/758; 257/173; 257/328; 257/355; 257/546; 438/118; 438/268; 438/309; 438/622
(58) Field of Search ................................ 257/173, 328, 257/355–363, 546, 758; 438/212, 268, 309

(56) References Cited

U.S. PATENT DOCUMENTS 5,963,409 A  * 10/1999  Chang ........................... 361/56

6,388,289 B1 * 5/2002 Kato ........................... 257/347

FOREIGN PATENT DOCUMENTS

| JP | 03073567 A | 3/1991 |
|---|---|---|
| JP | 2555890 | 9/1996 |

* cited by examiner

*Primary Examiner*—David Nelms
*Assistant Examiner*—Andy Huynh
(74) *Attorney, Agent, or Firm*—McDermott, Will & Emery

(57) ABSTRACT

In a semiconductor device according to the present invention, an n-type MISFET 12 including a semiconductor substrate 11, a source region 16, a drain region 17 and a gate electrode 19 is provided. On the semiconductor substrate 11, a first interlevel insulating film 13 covering the MISFET 12, a second interlevel insulating film 14 and third interlevel insulating film 15 are provided. On the first interlevel insulating film 13, a first gate interconnect 25 for electrically connecting a gate electrode 19 and the outside, a first drain interconnect for electrically connecting the drain region and the outside are provided so as to face each other with part of a second interlevel insulating film 14 interposed therebetween.

11 Claims, 9 Drawing Sheets

SEMICONDUCTOR DEVICE AND METHOD FOR FABRICATING THE SAME

BACKGROUND OF THE INVENTION

The present invention related to semiconductor devices and methods for fabricating a semiconductor device, and more particularly relates to a semiconductor device used for protecting an internal circuit from electrostatic destruction and a method for fabricating the same.

In a semiconductor device, signals are transmitted and received between an internal circuit and the outside of the device via an input/output pad. From the input/output pad to the internal circuit, not only signals for driving the internal circuit but also static electricity unexpectedly generated outside of the device is supplied. When large static electricity is supplied to the internal circuit, elements provided in the internal circuit may be damaged.

To avoid such electrostatic destruction of the internal circuit, an electrostatic protection device or an electrostatic protection circuit including an electrostatic protection device are provided between an internal circuit and an input/output pad in a semiconductor device. As a widely used electrostatic protection device, a parasitic bipolar transistor having the source (S)—substrate (B)—drain (D) structure for an MISFET is known.

Hereinafter, the structure of an electrostatic protection device will be described with reference to FIG. 9. FIG. 9 is a cross-sectional view schematically illustrating the structure of a known semiconductor device using an npn type parasitic bipolar transistor.

As shown in FIG. 9, in the known semiconductor device, provided are an internal circuit 81 and an input/output pad 82 which allows signal transmission and reception between the internal circuit 81 and the outside of the semiconductor device, an electrostatic protection device 83 connected between the internal circuit 81 and the input/output pad 82 and having an n-type MISFET structure. The electrostatic protection device 83 includes a semiconductor substrate 90, source and drain regions 91 and 92 provided in the semiconductor substrate 90 so as to be spaced apart from each other, a source electrode 93 provided on the source region 91, a drain electrode 94 provided on the drain region 92, a gate insulating film 95 provided on the semiconductor substrate 90, a gate electrode 96 provided on the gate insulating film 95, a sidewall spacer 97 provided on each of the side faces of the gate insulating film 95, and a resistance 98 connected to the gate electrode 96.

The drain electrode 94 of the electrostatic protection device 83 is connected between the internal circuit 81 and the input/output pad 82. Meanwhile, the gate electrode 96, the source electrode 93 and the semiconductor substrate 90 are connected to a ground potential 99 to be grounded. When the electrostatic protection device 83 functions as a parasitic bipolar transistor, the drain region 92 serves as a collector 101, the source region 91 serves as an emitter 100, and a region of the semiconductor substrate 90 located between the source and drain regions 91 and 92 serves as a base 102. Note that a substrate resistance 104 is illustrated in FIG. 9 to schematically show that the semiconductor substrate 90 functions as a resistance when the electrostatic protection device 83 functions as a parasitic bipolar transistor.

Next, the operation mechanism of the electrostatic protection device 83 will be described with reference to FIG. 9. When an excessive negative voltage caused by static electricity is applied from the outside of the semiconductor device to the input/output pad 82, an electric current flows from the ground potential 99 in the direction toward the input/output pad 82 so that static electricity is discharged. The electric current flows according to forward characteristics of a pn junction formed by the n-type drain region 92 of the semiconductor substrate 90 and a p-type region of the semiconductor substrate 90 connected to the ground potential 99. Thus, the excessive negative voltage applied to the input/output pad 82 is clamped. Therefore, the internal circuit is protected from the excessive voltage.

On the other hand, when an excessive positive voltage is applied to the input/output pad 82, the operation mode of the electrostatic protection device 83 is turned from an MISFET mode to a bipolar transistor mode. This operation will be specifically described hereinafter. When an excessive voltage is applied from the input/output pad 82 to the drain electrode 94, an electric current flows to the ground potential 99 via the drain electrode 94, the semiconductor substrate 90 and the source electrode 93 so that static electricity is discharged. As the voltage applied to the drain electrode 94 is increased, impact ionization is accelerated at the edge of drain region 92 of the n-type MISFET and therefore a substrate current 103 is gradually increased. When the substrate current 103 flows in the substrate resistance 104, a voltage drop occurs to increase the potential of the base 102. When the base potential is increased to a certain extent, the parasitic bipolar transistor is conducted so that a large current flows from the collector 101 (i.e., the drain region 92) to the emitter 100 (i.e., the source region 91). A voltage applied to the drain to turn the operation mode of the electrostatic protection device from the operation mode as an MISFET to the operation mode as a bipolar transistor is called "trigger voltage."

FIG. 10 is a graph showing the relation between the voltage level and the current level in a transistor exhibiting a snap-back characteristic. In the electrostatic protection device 83, a current flows according to the snap-back characteristic shown in FIG. 10. Thus, a voltage applied to the drain electrode 94 is suppressed lower than the trigger voltage. Normally, the trigger voltage is lower than the breakdown voltage of the internal circuit device and therefore the internal circuit is protected from an excessive voltage.

Note that the resistance 98 of FIG. 9 has the effect of reducing the trigger voltage. The principle of the effect will be described hereinafter. In general, the drain region 92 of the MISFET is formed so as to overlap with an edge portion of the gate electrode 96. Thus, a capacitance exists between the gate and the drain. When an excessive positive voltage caused by static electricity is applied to the drain electrode 94 with the capacitance formed, a charge current generated due to the capacitance momentarily flows from the drain electrode 94 to the ground potential 99 via the gate electrode 96 and the resistance 98. Accordingly, a voltage drop by the resistance 98 occurs and thus the potential of the gate electrode 96 is increased. When the potential of the gate electrode 96 is increased, the current flowing between the drain and the source is increased, thus accelerating impact ionization. Therefore, the substrate current 103 is increased, and thus a large voltage drop by the substrate resistance 104 occurs to increase the base potential. As a result, the parasitic bipolar transistor is easily conducted. As has been described, with the resistance 98 provided, the level of a trigger voltage when an excessive positive voltage caused by static electricity is applied can be reduced.

Note that the above-described electrostatic protection device was disclosed in Japanese Unexamined Patent Publication No. 3-73567.

In the known semiconductor device, however, the following problems arise.

Generally, MISFETs are designed so that deterioration of the gate insulating film therein due to injection of hot carriers is suppressed. More specifically, in MISFETs, impurity profiles are formed so that an electric field at the edge of the drain can be relaxed. Accordingly, the substrate current generated through impact ionization is reduced and thus the voltage drop by a substrate resistance is reduced. This results in an increase in the trigger voltage. Therefore, it becomes difficult to have a parasitic bipolar transistor conducted.

Moreover, in recent years, the thickness of a gate insulating film in an MISFET for an internal circuit has been reduced to 3 nm or less. Also, the gate breakdown voltage is reduced to 10 volt or less.

Therefore, when with a high trigger voltage, an excessive positive voltage caused by static electricity is applied to a semiconductor device, a higher voltage than the breakdown voltage is applied to a gate insulating film in an internal circuit used for the MISFET. This may cause destruction of the gate insulating film.

SUMMARY OF THE INVENTION

It is therefore an object of the present invention to devise a measure for effectively reducing a trigger voltage in a transistor exhibiting a sna-back characteristic and thereby provide a highly electrostatic protective semiconductor device and a method for fabricating the same.

A semiconductor device according to the present invention is characterized by comprising: a semiconductor layer; a source region provided in the semiconductor layer; a drain region provided in the semiconductor layer so as to be spaced apart from the source region; a gate insulating film provided on the semiconductor layer; a gate electrode provided on the gate insulating film; a first interlevel insulating film provided on the semiconductor layer so as to cover the gate electrode; a first gate interconnect provided on the first interlevel insulating film so as to be electrically connected to the gate electrode; a first drain interconnect provided on the first interlevel insulating film so as to be electrically connected to the drain region; and a second interlevel insulating film formed on the first interlevel insulating film so as to cover the first gate interconnect and the first drain interconnect, wherein part of the first gate interconnect extends in the gate width direction so that the part of the first drain interconnect and part of the first gate interconnect face each other with part of the second interlevel insulating film interposed therebetween.

Thus, a capacitance can be held between the first gate interconnect and the first drain interconnect, resulting in reduction in the trigger voltage. Therefore, a parasitic bipolar transistor can be easily conducted.

If the inventive semiconductor device further includes a second drain interconnect provided on the second interlevel insulating film so as to be electrically connected to the first drain interconnect, the drain region and members located outside of the semiconductor device can be electrically connected to each other by the second drain interconnect.

If the thicknesses of the first drain interconnect and the first gate interconnect are larger than that of the second drain interconnect, a larger capacitance can be held.

If the part of the second interlevel insulating film interposed between the parts of the first drain interconnect and the first gate interconnect is formed of a high dielectric material, a larger capacitance can be held.

It is preferable that the high dielectric material is silicon nitride.

If the inventive semiconductor device further includes a second gate interconnect provided on the second interlevel insulating film so as to be electrically connected to the first gate interconnect; and a third interlevel insulating film provided on the second interlevel insulating film so as to cover the second drain interconnect and the second gate interconnect and in the inventive semiconductor device, parts of the second drain interconnect and the second gate interconnect extend so as to face each other, a larger capacitance can be held.

If the part of the third interlevel insulating film interposed between the parts of the second drain interconnect and the second gate interconnect is formed of a high dielectric material, a larger capacitance can be held.

It is preferable that the high dielectric material is silicon nitride.

If the inventive semiconductor device further includes a first source interconnect provided on the first interlevel insulating film so as to be electrically connected to the source region and in the inventive semiconductor device, the distance between the first source interconnect and the first gate interconnect is greater than that between the first drain interconnect and the first gate interconnect, the distance between the first drain interconnect and the first gate interconnect is smaller than that in a known semiconductor device. Therefore, a capacitance can be more effectively held between the first drain interconnect and the first gate interconnect.

If the drain region is electrically connected to the internal circuit and the input/output terminal that can input a signal into the internal circuit, it is possible to prevent destruction of the internal circuit even with an excessive voltage caused by static electricity applied to the input/output terminal.

It is preferable that the gate electrode is electrically connected to the resistance.

A method for fabricating a semiconductor device according to the present invention includes: the step a) of forming a gate electrode on a semiconductor layer with a gate insulating film interposed therebetween; the step b) of forming source and drain regions in the semiconductor layer; the step c) of forming a first interlevel insulating film over the semiconductor layer after the step b); the step d) of forming a first gate interconnect on the first interlevel insulating film so as to be electrically connected to the gate electrode and extend in the gate width direction; the step e) of forming a first drain interconnect on the first interlevel insulating film so as to be electrically connected to the drain region and have part facing part of the first gate interconnect in the gate width direction; and the step f) of forming a second interlevel insulating film on the first interlevel insulating film so as to cover the first gate interconnect and the first drain interconnect.

Thus, a trigger voltage is reduced by a capacitance held between a first gate interconnect and a first drain interconnect. Therefore, a semiconductor device that can be easily conducted as a parasitic bipolar transistor can be obtained.

If the inventive method further includes the step g) of forming a second drain interconnect on the second interlevel insulating film so as to be electrically connected to the first drain interconnect, a semiconductor device connectable to the outside of the semiconductor device by a second drain interconnect can be obtained.

If in the inventive method, the thicknesses of the first drain interconnect and the first gate interconnect are larger than that of the second drain interconnect, a larger capacitance can be held.

If the inventive method further includes the step h) of forming a second gate interconnect on the second interlevel insulating film so as to be electrically connected to the first gate interconnect and have part facing part of the second drain interconnect, a larger capacitance can be held.

If the inventive method further includes, after the step h), the step j) of forming a third interlevel insulating film in which at least part is formed of a high dielectric material on the second interlevel insulating film, a larger capacitance can be held.

If in the step f), part of the second interlevel insulating film is formed of a high dielectric material, a larger capacitance can be held.

If the inventive method further includes the step i) of forming a first source interconnect on the first interlevel insulating film so as to be electrically connected to the source region and the distance between the first source interconnect and the first gate interconnect is greater than that between the first drain interconnect and the first gate interconnect, the distance between the first drain interconnect and the first gate interconnect is smaller than that in a known semiconductor device. Therefore, a capacitance can be more effectively held between the first drain interconnect and the first gate interconnect.

DESCRIPTION OF THE PREFERRED EMBODIMENTS

First Embodiment

In a first embodiment of the present invention, a semiconductor device in which a capacitance stored between a first gate interconnect and a first drain interconnect is increased and thereby a trigger voltage is reduced, and a method for fabricating the same will be described.

Figure 1A:
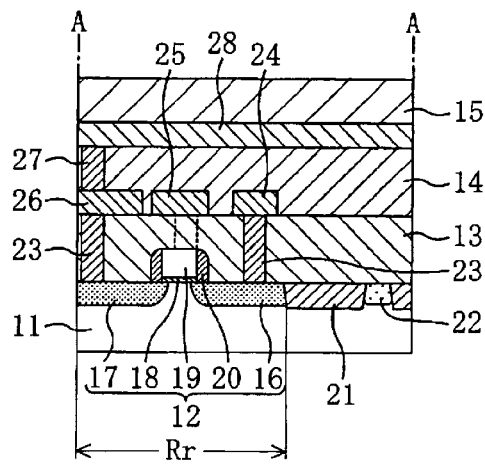
FIG. 1A is a cross-sectional view showing a layout for a semiconductor device according to a first embodiment of the present invention.
Figure 1B:
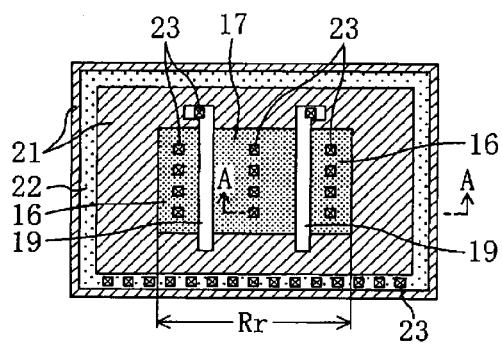
FIGS. 1B through 1D are plane views showing layouts of interconnects in the semiconductor device.
Figure 1C:
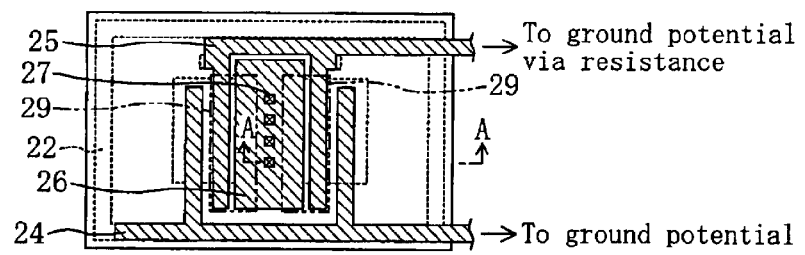
Figure 1D:
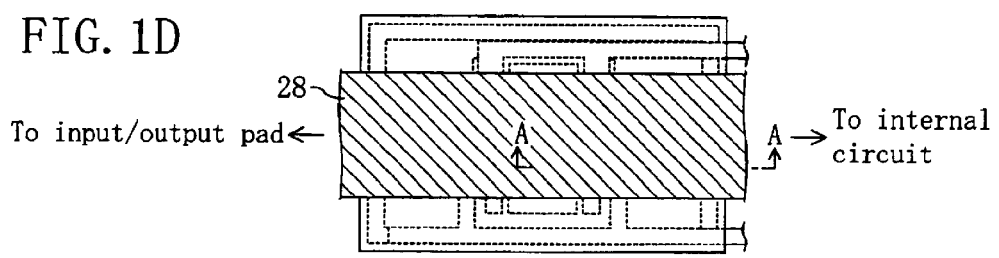

First, a semiconductor device of this embodiment will be described with reference to FIGS. 1A through 1D. FIG. 1A is a cross-sectional view showing a layout for the semiconductor device of the first embodiment. FIG. 1B is a plane view showing the top view layout of a semiconductor device. FIG. 1C is a plane view showing the layout of interconnects provided on a first interlevel insulating film. And FIG. 1D is a plane view showing interconnects provided on a second interlevel insulating film. Note that FIG. 1A shows a cross section taken along the line A—A shown in FIGS. 1B through 1D. In FIGS. 1A through 1D, an input/output pad and an internal circuit are omitted.

As shown in FIG. 1A, in the semiconductor device of this embodiment, an n-type MISFET 12 is provided as an electrostatic protection device in a semiconductor substrate (semiconductor layer) 11. On the semiconductor substrate 11, first, second and third interlevel insulating films 13, 14 and 15 are stacked.

The n-type MISFET 12 is provided in a device forming region Rr in the semiconductor substrate 11. The n-type MISFET 12 including the semiconductor substrate 11 containing an impurity at a concentration of $3.5\times10^{17}$ cm$^{-3}$, source and drain regions 16 and 17 which are formed in the semiconductor substrate 11 so as to be spaced apart from each other and each of which contains an n-type impurity at a concentration of $4.0\times10^{20}$ cm$^{-3}$, a gate insulating film 18 formed on a region of the semiconductor substrate 11 located between the source and drain regions 16 and 17 and having a thickness of 7.5 nm, a gate electrode 19 formed on the gate insulating film 18 and having a gate length of 40 nm, and a sidewall spacer 20 formed of an insulating material on each of the side faces of the gate electrode. The gate electrode 19 and source region 16 of the n-type MISFET 12 are electrically connected, via an associated one of first contact plugs 23, to a first gate interconnect 25 and a first source interconnect 24 which are provided on the first interlevel insulating film 13, respectively, and then both are connected to the outside of the semiconductor device.

As shown in FIG. 1B, the device forming region Rr is surrounded by an isolation 21 formed of an insulating layer and the isolation 21 are surrounded by a guard band 22 containing a p-type impurity at a concentration of $2\times10^{20}$ cm$^{-3}$. Each of the first contact plugs 23 passing through the first interlevel insulating film 13 (shown in FIG. 1A) is provided so as to be located on the source region 16, the drain region 17, the gate electrode 19 or the guard band 22.

In FIG. 1C, although the first interlevel insulating film 13 is omitted, the members provided on the first interlevel insulating film 13 are indicated by the solid lines and the members provided under the first interlevel insulating film 13 are indicated by the dashed lines. Note that the first interlevel insulating film 13 is formed so as to have a thickness of 480 nm. As shown in FIG. 1C, the gate electrode 19 (shown in FIG. 1B) is electrically connected to the first gate interconnect 25 having a thickness of 250 nm. The first gate interconnect 25 is connected to the ground potential (not shown) via a resistance (not shown). The source region 16 (shown in FIG. 1B) is electrically connected to the first source interconnect 24 having a thickness of 250 nm. The first source interconnect 24 extends to cover associated ones of the first contact plugs 23 provided on the guard band 22 and to be connected to the ground potential (not shown). The drain region 17 (shown in FIG. 1B) is electrically connected to the first drain interconnect 26 having a thickness of 250 nm. And second contact plugs 27 are provided on the first drain interconnect 26.

In the semiconductor device of this embodiment, as shown in FIG. 1C, the first gate interconnect 25 extends so that part thereof is located above the gate electrode 19 and the part faces a side face of the first drain interconnect 26. More specifically, the first gate interconnect 25 is provided not only in a region of the second interlevel insulating film 14 ranging from a point over an associated one of the first contact plugs 23 to the ground potential but also in a region thereof extending along the side faces of the first drain interconnect 26. Note that parts of the first gate interconnect 25 and the first drain interconnect 26 which extend so as to face each other compose a capacitance holding portion 29. The capacitance value of the capacitance holding portion 29 is determined by the areas of the parts of the first gate interconnect 25 and the first drain interconnect 26 facing each other and the distance therebetween. More specifically, if the areas of the parts thereof facing each other are enlarged, or the distance between the first gate interconnect and the first drain interconnect 26 is increased, the capacitance value can be increased.

Conventionally, a gate interconnect is formed generally so as to be connected to a gate contact but not to extend to a point above a gate electrode. Even when a gate interconnect is formed to extend to a point above a gate electrode according to a layout of interconnects, the distance between the gate interconnect and a first drain interconnect is the same as that between the gate interconnect and a first source interconnect. In contrast, in this embodiment, the first gate interconnect 25 is formed to extend to a point above the gate electrode 19 and the distance between the first gate interconnect 25 and the first drain interconnect 26 is smaller than that between the first gate interconnect 25 and the first source interconnect 24. Specifically, when the distance between the first gate interconnect and the first drain interconnect 26 is reduced to the minimum breadth (i.e., about 0.2 $\mu$m) of the interconnect layout rule, a larger capacitance can be held.

Note that in order to reduce the distance between the first gate interconnect 25 and the first drain interconnect 26, the width of the first gate interconnect 25 or the width of the first drain interconnect 26 may be increased.

In FIG. 1D, the second interlevel insulating film 14 is omitted. The members provided on the second interlevel insulating film 14 are indicated by the solid lines. And the members provided under the second interlevel insulating film 14 are indicated by the dashed lines. Note that the second interlevel insulating film 14 is formed so as to have a thickness of 700 nm. The first drain interconnect 26 (shown in FIG. 1C) is electrically connected to a second drain interconnect 28 having a thickness of 340 nm. The second is drain interconnect 28 is connected to the input/output pad (not shown) and the internal circuit (not shown).

Next, a method for fabricating the semiconductor device of this embodiment will be described with reference to FIGS. 2A through 2E. FIGS. 2A through 2E are cross-sectional views illustrating respective process steps for fabricating the semiconductor device according to the first embodiment.

Figure 2A:
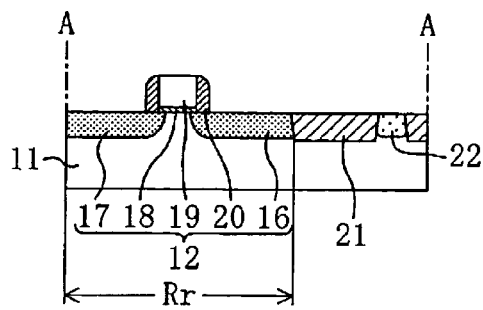
FIGS. 2A through 2E are cross-sectional views illustrating respective process steps for fabricating the semiconductor device of the first embodiment.

First, in the process step shown in FIG. 2A, a guard band 22 including an isolation 21 and a p-type doped layer is formed in a semiconductor substrate 11 by process steps for forming a regular n-type MISFET. In a device forming region Rr-of the semiconductor substrate 11, formed is an n-type MISFET 12 including source and drain regions 16 and 17, a gate insulating film 18, a gate electrode 19, and a sidewall spacer 20.

Figure 2B:
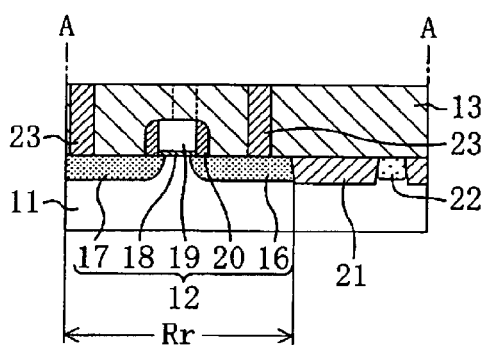

Next, in the process step shown in FIG. 2B, a first interlevel insulating film 13 of a BPSG (boron-phospho silicate glass) is deposited on the n-type MISFET 12 by CVD and then the surface of the first interlevel insulating film 13 is planarized by CMP. Subsequently, using a photolithography technique and a dry etching technique, contact holes are formed so as to pass through the first interlevel insulating film 13. Thereafter, the contact holes are filled with tungsten (W) and the surfaces of the fillings are planarized by CMP, thereby forming first contact plugs 23. Each of the first contact holes 23 reaches the source region 16, the drain region 17, the gate electrode 19 or the guard band 22.

Figure 2C:
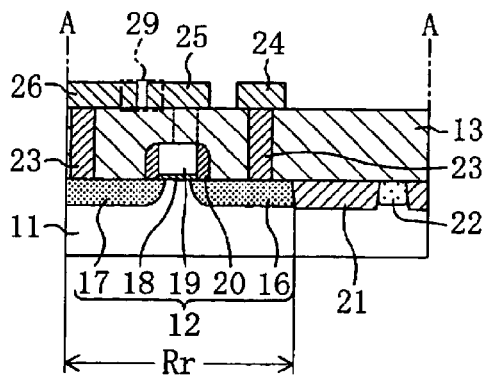

Next, in the process step shown in FIG. 2C, a conductive film of an interconnect material such as aluminum is deposited by sputtering. Then, the conductive film is patterned using a photolithography technique and a dry etching technique, thereby forming a first gate interconnect 25, a first source interconnect 24 and a first drain interconnect 26 in the layout pattern of FIG. 1C.

Figure 2D:
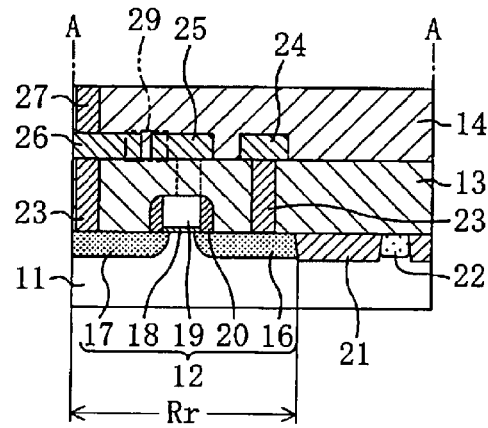

Next, in the process step shown in FIG. 2D, a FSG (fluorinated silicate glass) film is deposited on the first interlevel insulating film 13 by CVD and then the surface of the first interlevel insulating film 13 is planarized by CMP, thereby forming a second interlevel insulating film 14. Next, using a photolithography technique and a dry etching technique, contact holes are formed so as to pass through the second interlevel insulating film 14. Thereafter, the contact holes are filled with tungsten and then the surfaces of the fillings are planarized, thereby forming second contact plugs 27.

Figure 2E:
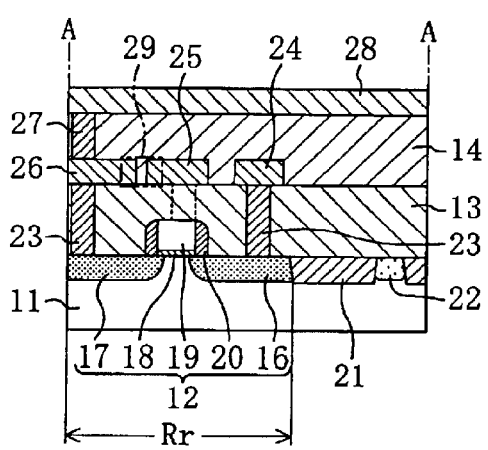

Next, in the process step shown in FIG. 2E, a conductive film of an interconnect material such as aluminum is deposited by sputtering. Then, the conductive film is patterned using a photolithography technique and a dry etching technique, thereby forming a second drain interconnect 28 in the layout pattern of FIG. 1D. Thereafter, a third interlevel insulating film 15 (shown in FIG. 1A) of FSG is formed on the second interlevel insulating film 14 by CVD. In the above-described process steps, the semiconductor device of this embodiment is completed.

In this embodiment, the first gate interconnect 25 is formed so as to extend to a point above the gate electrode 19, and the first gate interconnect 25 and the first drain interconnect 26 are formed in parallel to each other so as to be spaced apart from each other by a small distance. In this manner, a larger gate-drain capacitance can be achieved than in a known semiconductor device, and thus the trigger voltage can be reduced. The reasons for this will be described hereinafter.

Figure 9:
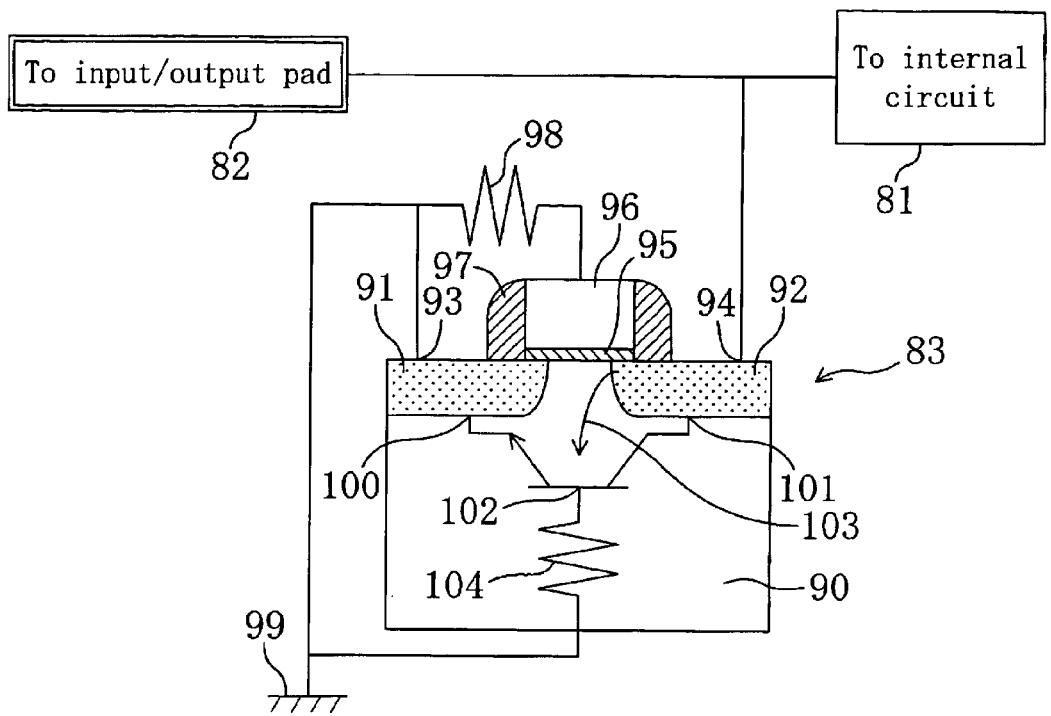
FIG. 9 is a cross-sectional view schematically illustrating the structure of a known semiconductor device using an npn type parasitic bipolar transistor.
Figure 10:
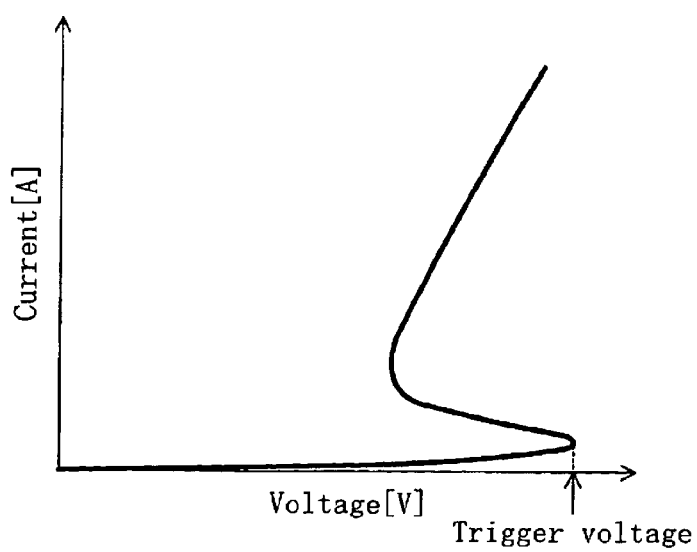
FIG. 10 is a graph showing the relation between the voltage level and the current level in a bipolar transistor exhibiting a snap-back characteristic.

The drain region 17 of the n-type MISFET 12 is formed so as to overlap with an edge portion of the gate electrode 19. Thus, a capacitance exists between the gate and the drain. When with such the capacitance formed, an excessive positive voltage caused by static electricity is applied to the drain region 17, a charge current generated due to the capacitance momentarily flows to the ground potential (not shown) via the drain electrode 19. At this time, the charge current flows in the resistance 98 shown in FIG. 9 to increase the potential of the gate electrode 19. In the semiconductor device of this embodiment, a large capacitance held between the gate and the drain than in the known semiconductor device. Therefore, the potential of the gate electrode 19 is further increased and thus an increased electric current flows between the drain and the source. As a result, impact ionization is accelerated. Accordingly, the substrate current 103 shown in FIG. 9 is increased and thus the potential of the base 102 is easily increased. Therefore, the trigger voltage is reduced so that a parasitic bipolar transistor is easily conducted.

As has been described, according to the present invention, the gate-drain capacitance of an n-type MISFET 12 is increased, and thereby the trigger voltage of the MISFET exhibiting a snap-back characteristic is reduced to a lower level than that in the known semiconductor device. In this manner, it is possible to prevent inconveniences due to a large static electricity applied to the internal circuit.

Second Embodiment

In a second embodiment, a modified example of the first embodiment will be described.

Figure 3:
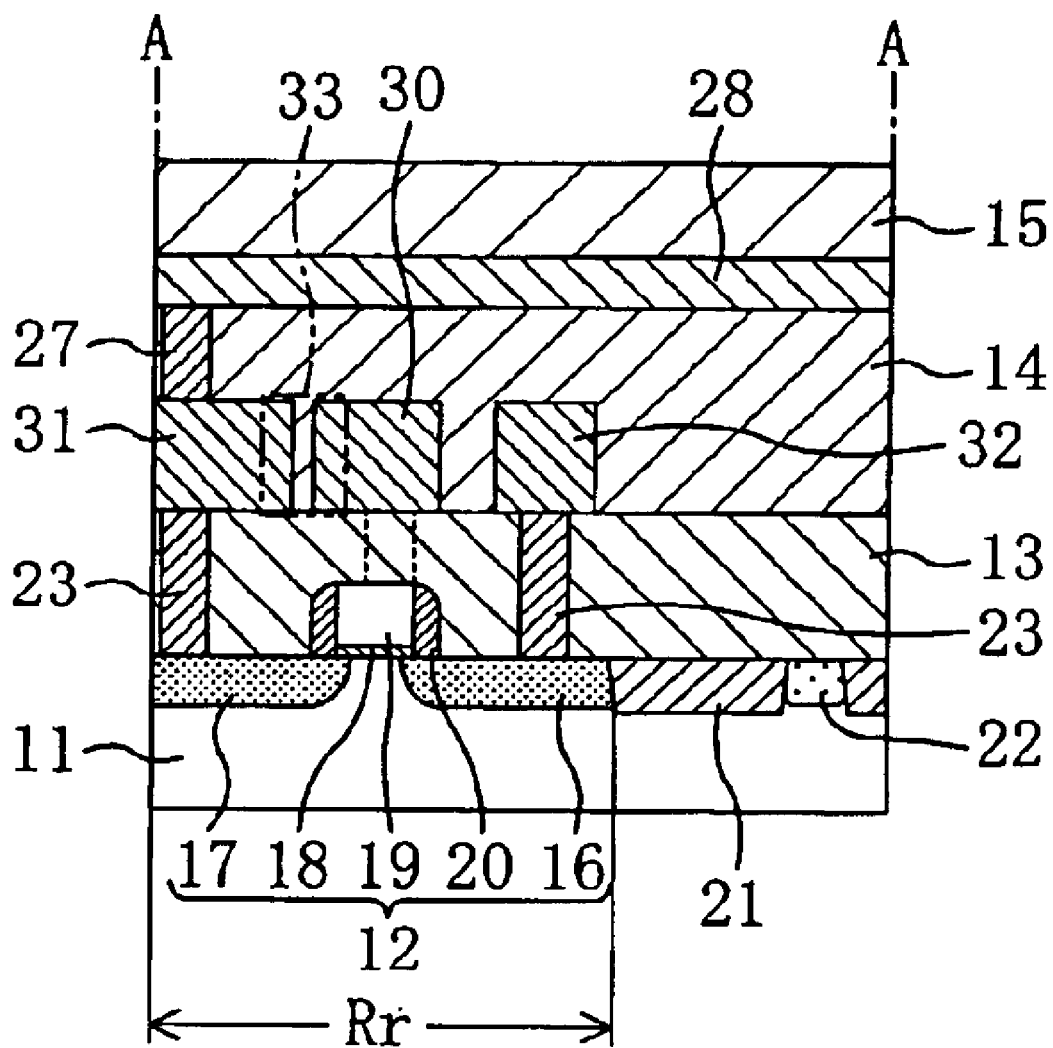
FIG. 3 is a cross-sectional view illustrating the structure of a semiconductor device according to a second embodiment of the present invention.

FIG. 3 is a cross-sectional view illustrating the structure of a semiconductor device according to the second embodiment. The semiconductor device of this embodiment differs from that of the first embodiment in that the thicknesses of a first gate interconnect 30 and a first drain interconnect 31 are larger than those of the counterparts in the known semiconductor device. Thus, the thicknesses of the first gate interconnect 30 and the first drain interconnect 31 are larger than that of the second drain interconnect 28. This contrasts with the known semiconductor device in which a second drain interconnect has a larger thickness than that of a first drain interconnect so that a very small device (MISFET) and the outside of the device are connected. Note that each of the first drain interconnect 31 and the first gate interconnect 30 preferably has a thickness of not less than 500 nm and not more than 700 nm. In this case, no inconvenience arises in other layers or the like and thus a larger capacitance can be held.

The semiconductor device of this embodiment has the same plane layouts as those of the first embodiment shown in FIGS. 1B through 1D and therefore illustration and description for the layouts will be omitted.

Next, a method for fabricating a semiconductor device according to this embodiment will be described with reference to FIGS. 4A through 4E. FIGS. 4A through 4E are cross-sectional views illustrating respective process steps for fabricating the semiconductor device of the second embodiment. Note that plane layout patterns of the semiconductor device of this embodiment is the same as those of the first embodiment and therefore FIGS. 1B through 1D will be referred.

First, in the process step shown in FIG. 4, a guard band 22 including an isolation 21 and a p-type doped layer is formed in a semiconductor substrate 11 by following process steps for forming a known MISFET. In a device forming region Rr of the semiconductor substrate 11, formed is an n-type MISFET 12 including source and drain regions 16 and 17, a gate insulating film 18, a gate electrode 19, and a sidewall spacer 20.

Figure 4A:
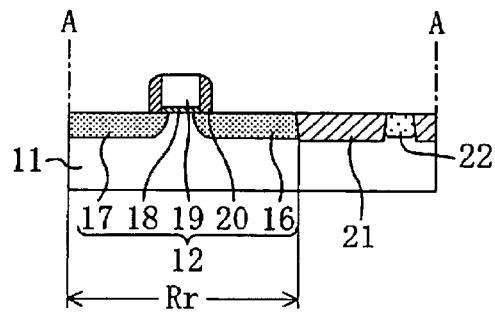
FIGS. 4A through 4E are cross-sectional views illustrating respective process steps for fabricating the semiconductor device of the second embodiment.
Figure 4D:
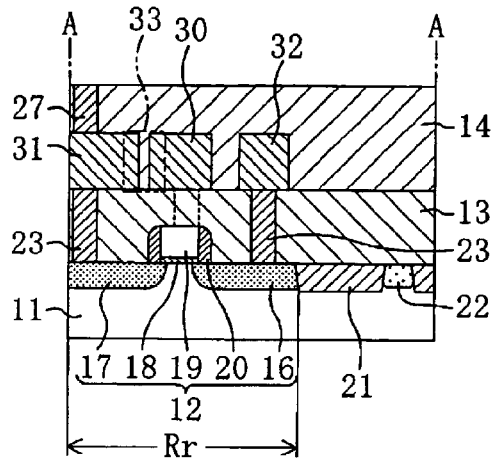
Figure 4B:
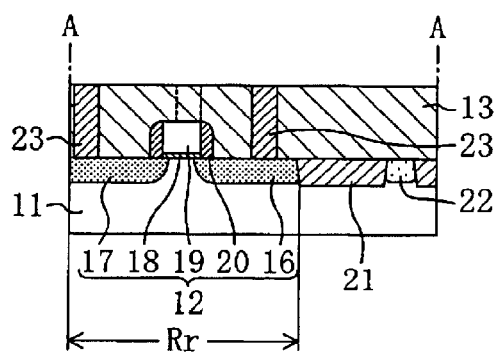

Next, in the process step show in FIG. 4B, a first interlevel insulating film 13 of a BPSG is deposited on the n-type MISFET 12 by CVD and then the surface of the first interlevel insulating film 13 is planarized by CMP. Subsequently, using a photolithography technique and a dry etching technique, contact holes are formed so as to pass through the first interlevel insulating film 13. Thereafter, the contact holes are filled with tungsten (W) and the surfaces of the fillings are planarized by CMP, thereby forming first contact plugs 23. Each of the first contact holes 23 reaches the source region 16, the drain region 17, the gate electrode 19 or the guard band 22.

Figure 4E:
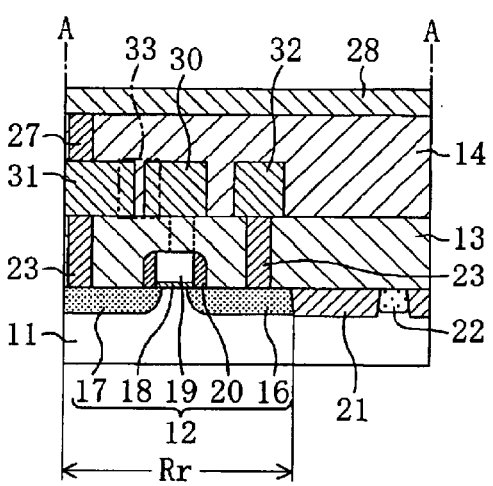
Figure 4C:
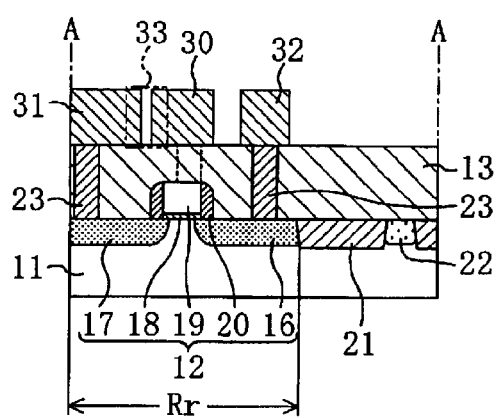

Next, in the process step shown in FIG. 4C, a conductive film of an interconnect material such as aluminum is deposited so as to have a thickness of 500 nm by sputtering. Then, the conductive film is patterned using a photolithography technique and a dry etching technique, thereby forming a first gate interconnect 30, a first source interconnect 32 and a first drain interconnect 31 in the layout pattern of FIG. 1C. In this case, parts of the first gate interconnect 30 and the first drain interconnect 31 compose a capacitance holding portion 33. In the capacitance holding portion 33, the areas of parts of the side face of the first gate interconnect 30 and the first drain interconnect 31 facing each other are larger than the counterparts in the first embodiment.

Note that in the process step of FIG. 4C, the first drain interconnect 31, the first gate interconnect 30 are formed of a single conductive film by patterning. Therefore, the first source interconnect 32 may be formed so as to have a larger thickness than the first source interconnect of the known device.

Next, in the process step shown in FIG. 4D, an FSG film is deposited on the first interlevel insulating film 13 by CVD and then the surface of the first interlevel insulating film 13 is planarized by CMP, thereby forming a second interlevel insulating film 14. Next, using a photolithography technique and a dry etching technique, contact holes are formed so as to pass through the second interlevel insulating film 14. Thereafter, the contact holes are filled with tungsten and then the surfaces of the fillings are planarized, thereby forming second contact plugs 27.

Next, in the process step shown in FIG. 4E, a conductive film of an interconnect material such as aluminum is deposited so as to have a thickness of 340 nm by sputtering. Then, the conductive film is patterned using a photolithography technique and a dry etching technique, thereby forming a second drain interconnect 28 in the layout pattern of FIG. 1D. Thereafter, a third interlevel insulating film 15 (shown in FIG. 3A) of FSG is 15 formed on the second interlevel insulating film 14 by CVD. In the above-described process steps, the semiconductor device of this embodiment is completed.

In this embodiment, the same effects as those in the first embodiment can be achieved. Furthermore, the thickness of a conductive film to be the first drain interconnect 31 in this embodiment is larger than that of a conductive film to be the first drain interconnect in the known semiconductor device, i.e., about 250 nm, and also larger than that of an conductive film to be the second drain interconnect in the known semiconductor device, i.e., about 340 nm. Accordingly, in this embodiment, a larger gate-drain capacitance than that in the first embodiment can be obtained and therefore the trigger voltage in a transistor exhibiting a snap-back characteristic can be effectively reduced.

Third Embodiment

In a third embodiment, a description will be made on an example in which a gate-drain capacitance is held by not only a first interconnect but also a second interconnect.

Figure 5A:
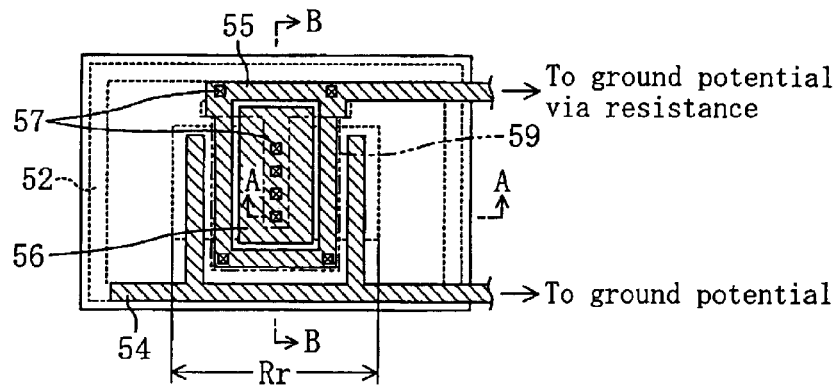
FIGS. 5A and 5B are plane views illustrating a layout of interconnects provided on the first interlevel insulating film in a semiconductor device of a third embodiment of the present invention.
Figure 5B:
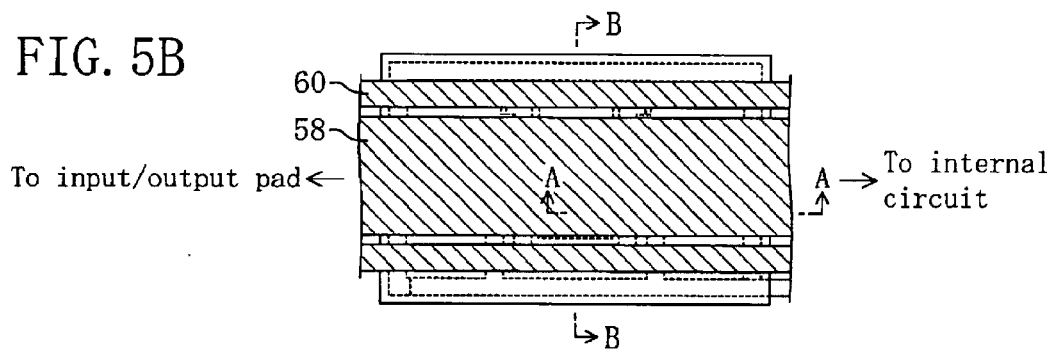
Figure 5C:
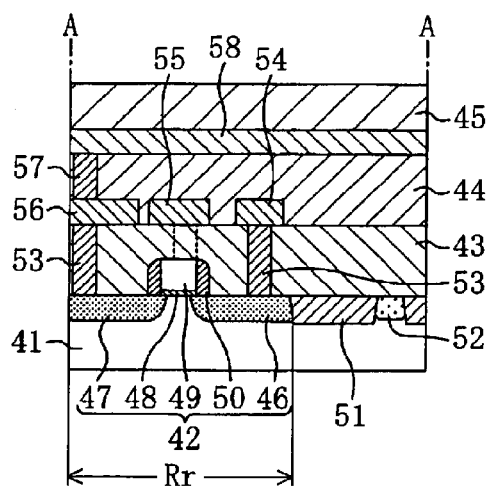
FIG. 5C is a cross-sectional view taken along the line A—A of FIGS. 5A and 5B, illustrating the structure of the semiconductor device.
Figure 5D:
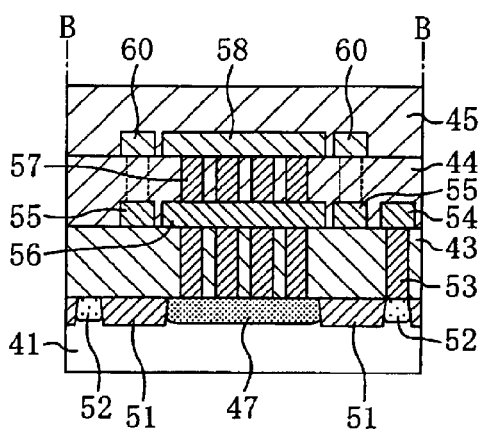
FIG. 5D is a cross-sectional view taken along the line B—B perpendicular to the line A—A of FIGS. 5A and 5B, illustrating the structure of the semiconductor device.

First, a semiconductor device according to this embodiment will be described with reference to FIGS. 5A through 5D. In the semiconductor device of this embodiment, first, second and third interlevel insulating films 43, 44 and 45 are provided on a semiconductor substrate 41 including an n-type MISFET 42. FIG. 5A is a plane view illustrating a layout of interconnects provided on the first interlevel insulating film in the semiconductor device of this embodiment. FIG. 5B is a plane view illustrating a layout of interconnects provided on the second interlevel insulating film in the semiconductor device. FIG. 5C is a cross-sectional view taken along the line A—A of FIGS. 5A and 5B, illustrating the structure of the semiconductor device. And FIG. 5D is a cross-sectional view taken along the line B—B perpendicular to the line A—A of FIGS. 5A and 5B, illustrating the structure of the semiconductor device. Note that in FIGS. 5A through 5D, an input/output pad and an internal circuit are omitted.

The third embodiment differs from the first embodiment in that an first gate interconnect 55 is connected to a second gate interconnect 60 via second contact plugs 57 and a second gate interconnect 60 is formed so as to be located in parallel to and close to a second drain interconnect 58. The structure of the semiconductor device of the third embodiment will be specifically described hereinafter. Description of the same parts as those of the first embodiment will be omitted.

As shown in FIG. 5A, a first source interconnect 54 having a thickness of 250 nm, a first gate interconnect 55, and a first drain interconnect 56 are formed on the first interlevel insulating film 43 (shown in FIG. 5C). The first source interconnect 54 is located above the source region 46 (shown in FIG. 5C), extends to a point on an associated one of the first contact plugs 53 located on the guard band 52, and reaches the ground potential (not shown). The first gate interconnect 55 is provided above a gate electrode 49 (shown in FIG. 5C) and is connected to the ground potential (not shown) via a resistance (not shown). The first drain interconnect 56 is provided above a drain region 47 (shown in FIG. 5C) and is surrounded by the first gate interconnect 55.

As shown in FIG. 5B, on the second interlevel insulating film 44, the second drain interconnect 58 is formed so as to cover a device formation region Rr and extend in the gate length direction, and a gate interconnect 60 is formed so as to extend along a side face of the second drain interconnect 58.

The gate electrode 49 provided on the semiconductor substrate 41 is connected to the first gate interconnect 55 via associated ones of first contact plugs 53, as shown in FIG. 5C. The first gate interconnect 55 is then connected to the second gate interconnect 60 via associated ones of the second contact plugs 57, as shown in FIG. 5D.

A source region 46 provided in the semiconductor substrate 41 is connected to the first source interconnect 54 via associated ones of the first contact plugs 53, as shown in FIG. 5C.

A drain region 47 provided in the semiconductor substrate 41 is connected to the second drain interconnect 58 via associated ones of the first contact plugs 53, the first drain interconnect 56 and associated ones of the second contact plugs 57, as shown in FIG. 5C.

Next, a method for fabricating a semiconductor device according to this embodiment will be described with reference to FIGS. 6A through 6E. FIGS. 6A through 6E are cross-sectional views taken along the line B—B shown in FIGS. 5A and 5B, illustrating respective process steps for fabricating the semiconductor device of the third embodiment.

Figure 6A:
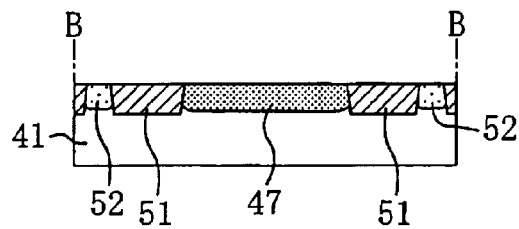
FIGS. 6A through 6E are cross-sectional views taken along the line B—B shown in FIGS. 5A and 5B, illustrating respective process steps for fabricating the semiconductor device of the third embodiment.

In the process step shown in FIG. 6A, a guard band 52 including an isolation 51 and a p-type doped layer is formed in a semiconductor substrate 41 by process steps for forming a regular n-type MISFET. In a device forming region Rr of the semiconductor substrate 41, formed is an n-type MISFET 42 (shown in FIG. 5C) including a drain region 47.

Figure 6D:
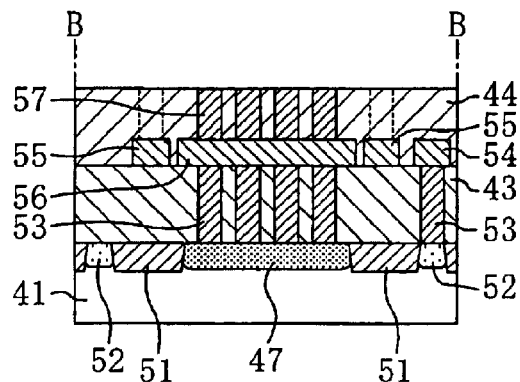
Figure 6B:
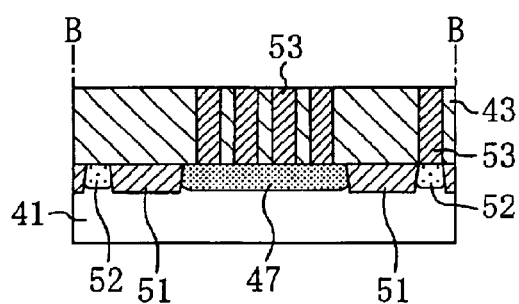

Next in the process step shown in FIG. 6B, a first interlevel insulating film 43 of a BPSG film is deposited on the semiconductor substrate 41 by CVD and then the surface of the first interlevel insulating film 43 is planarized by CMP. Subsequently, using a photolithography technique and a dry etching technique, contact holes are formed so as to pass through the first interlevel insulating film 43. Thereafter, the contact holes are filled with tungsten (W) and the surfaces of the fillings are planarized by CMP, thereby forming first contact plugs 53. Each of the first contact holes 53 reaches the source region 46, the drain region 47, the gate electrode 49 or the guard band 52 which are shown in FIG. 55C.

Figure 6E:
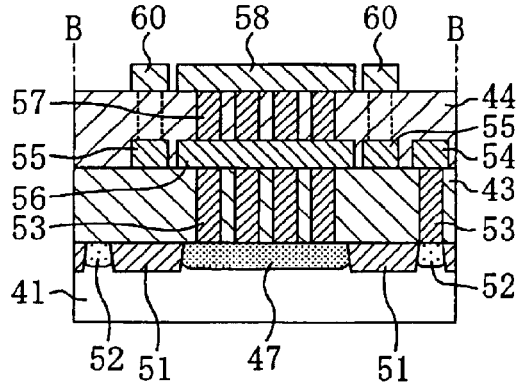
Figure 6C:
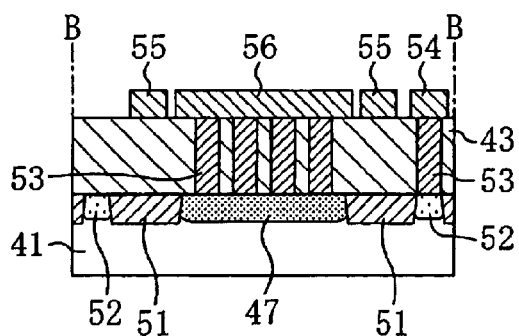

Next, in the process step shown in FIG. 6C, a conductive film of an interconnect material such as aluminum is deposited by sputtering. Then, the conductive film is patterned using a photolithography technique and a dry etching technique, thereby forming a first gate interconnect 55, a first drain interconnect 56 and a first source interconnect 54 in the layout pattern of FIG. 5A.

Next, in the process step shown in FIG. 6D, a FSG film is deposited on the first interlevel insulating film 43 by CVD and then the surface of the first interlevel insulating film 43 is planarized by CMU, thereby forming a second interlevel insulating film 44. Next, using a photolithography technique and a dry etching technique, contact holes are formed so as to pass through the second interlevel insulating film 44. Thereafter, the contact holes are filled with tungsten and then the surfaces of the fillings are planarized, thereby forming second contact plugs 57. Each of the second contact plugs 57 reaches the first gate interconnect 55 or the first drain interconnect 56.

Next, in the process step shown in FIG. 6E, a conductive film of an interconnect material such as aluminum is deposited by sputtering. Then, the conductive film is patterned using a photolithography technique and a dry etching technique, thereby forming a second gate interconnect 60 and a second drain interconnect 58 in the layout pattern of FIG. 5B. In the above-described process steps, the semiconductor device of this embodiment is completed.

In this embodiment, a capacitance can be held not only between the first gate interconnect 55 and the first drain interconnect 56 but also between the second gate interconnect 60 and the second drain interconnect 58. Accordingly, the trigger voltage in a transistor exhibiting a snap-back characteristic can be effectively reduced. Therefore, it is possible to prevent inconveniences due to a large static electricity applied to the internal circuit.

Fourth Embodiment

Figure 7A:
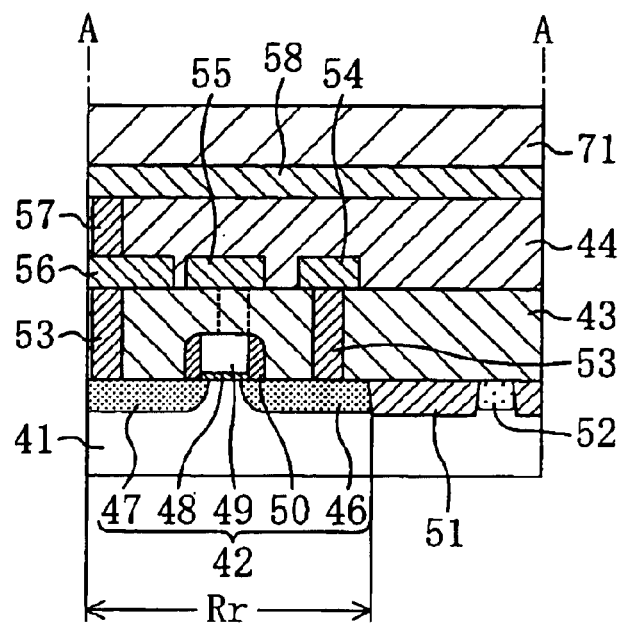
FIGS. 7A and 7B are cross-sectional views taken along the line A—A and along the line B—B, respectively, shown in FIGS. 5A and 5B, illustrating the structure of a semiconductor device according to a fourth embodiment.
Figure 7B:
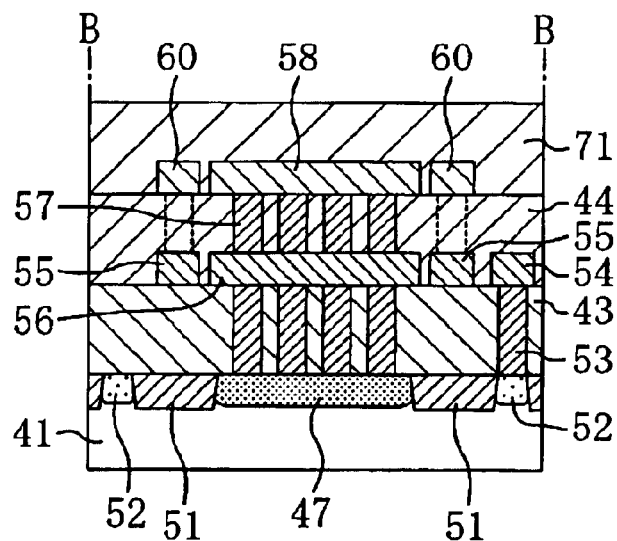

In a fourth embodiment, a modified example of the third embodiment will be described. A semiconductor device according to this embodiment has the same plane layout of interconnects as that of the third embodiment and therefore illustration and description for the layout will be omitted. A cross-sectional structure will be described with reference to FIGS. 7A and 7B. FIGS. 7A and 7B are cross-sectional views taken along the line A—A and along the line B—B, respectively, shown in FIGS. 5A and 5B, illustrating the structure of the semiconductor device of the fourth embodiment.

This embodiment differs from the third embodiment in that a high dielectric film 71 is provided as a third insulating film, as shown in FIGS. 7A and 7B. The high dielectric film 71 fills between the second gate interconnect 60 and the second drain interconnect 58. Herein, being high dielectric means having a relative dielectric constant of 5 or more. For example, when a silicon nitride film is used as a high dielectric film, a larger capacitance can be held without causing inconveniences in other regions.

Figure 8:
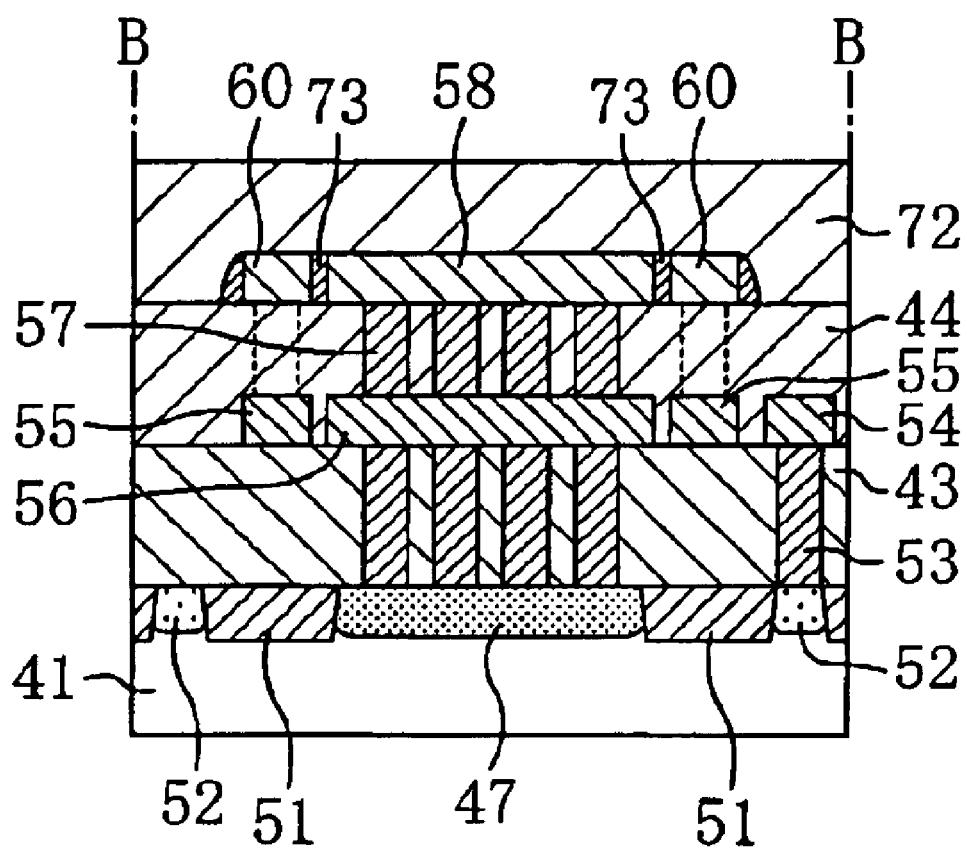
FIG. 8 is a cross-sectional view illustrating a modified example of the structure of the fourth embodiment.

FIG. 8 is a cross-sectional view illustrating a modified example of the structure of the fourth embodiment. As shown in FIG. 8, a region of the third insulating film located between the second gate interconnect 60 and the second drain interconnect 58 may be filled with the high dielectric portion 73, and an insulating film 72 may be provided so as to cover the second gate interconnect 60, the second drain interconnect 58, and the high dielectric portion 73.

The process step of forming the high dielectric portion 73 of FIG. 8 will be described. First, a high dielectric film is formed on the second interlevel insulating film 44 so as to cover the second gate interconnect 60 and the second drain interconnect 58. Next, anisotropic etching is performed such that the high dielectric portion 73 is left in a region of the insulating film in which interconnect layers are located close together. More specifically, the high dielectric portion 73 is left between the second gate interconnect 60 and the second drain interconnect 58 and on the side faces of the second gate interconnect 60 and the second drain interconnect 58.

In the fourth embodiment, a larger capacitance can be held between the second gate interconnect 60 and the second drain interconnect 58. Accordingly, the trigger voltage in the transistor exhibiting a snap-back characteristic can be effectively reduced.

Note that the high dielectric portion 73 shown in FIG. 8 may be provided between the first drain interconnect 56 and the first gate interconnect 55.

A semiconductor device according to the present invention is characterized in that it has an interconnect layout that allows an increased gate-drain capacitance and a high dielectric material is used as an insulating film for filling between interconnects. Thus, at a moment when an excessive voltage caused by static electricity is applied to a drain region, a large current flows in a resistance connected to a gate electrode due to a gate-drain capacitance. Accordingly, a larger voltage drop in the resistance occurs, compared to the known semiconductor device, resulting in an increase in the gate potential. As a result, a current flowing between the drain and the source is increased. Then, impact ionization is further accelerated to increase a substrate current flowing into a substrate resistance. This increases the voltage drop caused by the substrate resistance, thus resulting in an increase in the base potential. In the manner described above, the trigger voltage is reduced, so that a parasitic bipolar transistor is easily conducted. Therefore, an internal circuit can be reliably protected from static electricity.

What is claimed is:

1. A semiconductor device comprising:
   a semiconductor layer;
   a source region provided in the semiconductor layer;
   a drain region provided in the semiconductor layer so as to be spaced apart from the source region;
   a gate insulating film provided on the semiconductor layer;
   a gate electrode provided on the gate insulating film;
   a first interlevel insulating film provided on the semiconductor layer so as to cover the gate electrode;
   a first gate interconnect provided on the first interlevel insulating film so as to be electrically connected to the gate electrode;
   a first drain interconnect provided on the first interlevel insulating film so as to be electrically connected to the drain region; and
   a second interlevel insulating film formed on the first interlevel insulating film so as to cover the first gate interconnect and the first drain interconnect,
   wherein part of the first gate interconnect extends in the gate width direction so that the parts of the first drain interconnect and part of the first gate interconnect face each other with part of the second interlevel insulating film interposed therebetween.

2. The semiconductor device of claim 1, further comprising a second drain interconnect provided on the second interlevel insulating film so as to be electrically connected to the first drain interconnect.

3. The semiconductor device of claim 2, wherein the thicknesses of the first drain interconnect and the first gate interconnect area larger than that of the second drain interconnect.

4. The semiconductor device of claim 1, wherein the part of the second interlevel insulating film interposed between the parts of the first drain interconnect and the first gate interconnect is formed of a high dielectric material.

5. The semiconductor device or claim 4, wherein the high dielectric material is silicon nitride.

6. The semiconductor device of claim 2, further comprising:
   a second gate interconnect device provided on the second interlevel insulating film so as to be electrically connected to the first gate interconnect; and
   a third interlevel insulting film provided on the second interlevel insulating film so as to cover the second drain interconnect in the second gate interconnect,
   wherein parts of the second drain interconnect and the second gate interconnect extend so as to face each other.

7. The semiconductor device of claim 6, wherein part of the third interlevel insulating film interposed between the parts of the second drain interconnect and the second gate interconnect is formed of a high dielectric material.

8. The semiconductor device of claim 7, wherein the high dielectric material is silicon nitride.

9. The semiconductor device of claim 1, further comprising a first source interconnect provided on the first interlevel insulating film so as to be electrically connected to the source region,
   wherein the distance between the fist source interconnect and the first gate interconnect is larger than that between the first drain interconnect and the first gate interconnect.

10. The semiconductor device of claim 1, wherein the region is electrically connected to an internal circuit and an input/output terminal that can input a signal in to the internal circuit.

11. The semiconductor device of claim 1, wherein the gate electrode id electrically connected to a resistance.

* * * * *